United States Patent
Sabapathy et al.

(10) Patent No.: US 9,500,534 B2
(45) Date of Patent: Nov. 22, 2016

(54) RING OSCILLATOR PULSE WIDTH MODULATION CIRCUITRY WITH PROGRAMMABLE DELAY CIRCUITRY

(71) Applicant: Texas Instruments Incorporated, Dallas, TX (US)

(72) Inventors: Sam G. Sabapathy, Sugar Land, TX (US); Christine Chang, Bellaire, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/808,688

(22) Filed: Jul. 24, 2015

(65) Prior Publication Data
US 2015/0333747 A1    Nov. 19, 2015

Related U.S. Application Data

(62) Division of application No. 13/737,544, filed on Jan. 9, 2013, now Pat. No. 9,121,767, which is a division of application No. 13/006,167, filed on Jan. 13, 2011, now Pat. No. 8,373,482.

(51) Int. Cl.
| | |
|---|---|
| *G01K 7/00* | (2006.01) |
| *G01K 7/01* | (2006.01) |
| *G01K 7/32* | (2006.01) |
| *H03K 3/03* | (2006.01) |
| *H03K 7/08* | (2006.01) |

(52) U.S. Cl.
CPC . *G01K 7/00* (2013.01); *G01K 7/01* (2013.01); *G01K 7/32* (2013.01); *H03K 3/0315* (2013.01); *H03K 7/08* (2013.01)

(58) Field of Classification Search
CPC ............ G01K 7/00; G01K 7/01; G01K 7/32
See application file for complete search history.

(56) References Cited

U.S. PATENT DOCUMENTS

| | | | |
|---|---|---|---|
| 6,420,989 B1 * | 7/2002 | Herbold | H03L 7/16 341/155 |
| 2002/0079943 A1 * | 6/2002 | Dubey | G06F 1/04 327/291 |
| 2007/0168686 A1 * | 7/2007 | Pessolano | G06F 1/08 713/500 |

\* cited by examiner

*Primary Examiner* — Jeffrey Shin
(74) *Attorney, Agent, or Firm* — Lawrence J. Bassuk; Frank D. Cimino

(57) ABSTRACT

A method of programming a ring oscillator for use as a temperature sensor comprises selecting an initial number of delay elements for use in a ring oscillator. The method further comprise starting a system clock counter and counting pulses of the ring oscillator until the system clock counter reaches a programmed value. The method also comprises determining whether a number of counted ring oscillator pulses is between lower and upper count thresholds and changing the number of delay elements for the ring oscillator as a result of the number of counted ring oscillator pulses being less than the lower count threshold or greater than the upper count threshold.

9 Claims, 4 Drawing Sheets

RING OSCILLATOR PULSE WIDTH MODULATION CIRCUITRY WITH PROGRAMMABLE DELAY CIRCUITRY

This application is a Divisional of prior application Ser. No. 13/737,544, filed Jan. 9, 2013, now U.S. Pat. No. 9,121,767, issued Sep. 1, 2015;

Which was a Divisional of prior application Ser. No. 13/006,167, filed Jan. 13, 2011, now U.S. Pat. No. 8,373,482, issued Feb. 2, 2013.

BACKGROUND

It is often desirable to monitor temperature of a system during operation of one or more semiconductor devices contained in the system. Monitoring the temperature can be useful, for example, to detect and avoid a thermal runaway condition and calibrate chip-level module parameters that are dependent on temperature. Adding temperature sensors to a system unfortunately may increase the size of the system as well as add cost.

SUMMARY

The problems noted above are solved in large part by a system that employs a ring oscillator that is usable to calibrate delay elements for use with a pulse width modulator, as well as usable as a temperature sensor. Further, the ring oscillator is programmable for optimum use as a temperature sensor.

In accordance with at least one embodiment, a method of programming a ring oscillator for use as a temperature sensor comprises selecting an initial number of delay elements for use in a ring oscillator. The method further comprise starting system clock and ring oscillator counters and counting pulses of the ring oscillator until the system clock counter reaches a programmed value. The method also comprises determining whether a number of counted ring oscillator pulses is between lower and upper count thresholds and changing the number of delay elements for the ring oscillator as a result of the number of counted ring oscillator pulses being less than the lower count threshold or greater than the upper count threshold.

In accordance with another embodiment, a processor readable storage medium contains code that, when executed by a processor, causes the processor to perform various actions. For instance, the processor selects an initial number of delay elements for use in a ring oscillator and starts system clock and ring oscillator counters. The processor further counts pulses of the ring oscillator until the system clock counter reaches a programmed value, determines whether a number of counted ring oscillator pulses is between lower and upper count thresholds, and changes the number of delay elements for the ring oscillator as a result of the number of counted ring oscillator pulses being less than the lower count threshold or greater than the upper count threshold.

In accordance with yet another embodiment, a system comprises a programmable ring oscillator and a processor. The processor is configured to: select an initial number of delay elements for use in the ring oscillator; start a system clock counter, count pulses of the ring oscillator until the system clock counter reaches a programmed value, determine whether a number of counted ring oscillator pulses is between lower and upper count thresholds, and change the number of delay elements for the ring oscillator as a result of the number of counted ring oscillator pulses being less than the lower count threshold or greater than the upper count threshold.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
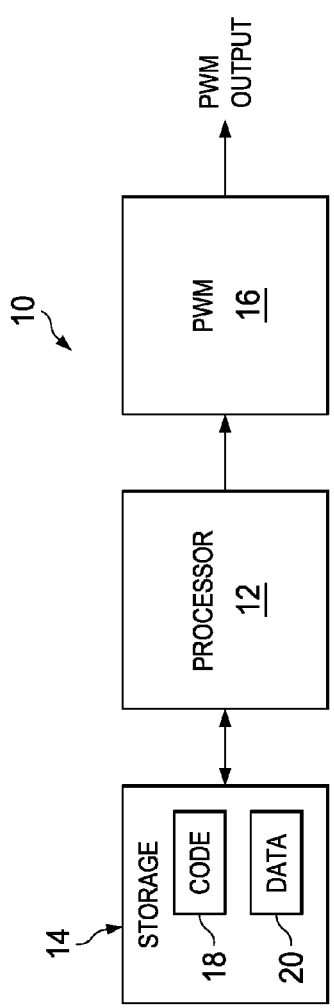
FIG. 1 shows a system containing a pulse width modulator in accordance with the preferred embodiments of the invention.

FIG. 1 shows a system 10 in accordance with a preferred embodiment of the invention. As shown, the system 10 comprises a processor core 12 containing or coupled to storage 14 and a pulse width modulator (PWM) 16. The system 10 may comprise a standalone system or may comprise a controller configured to be integrated into a larger system. In some embodiments, the PWM 16 is a multi-channel PWM in which multiple PWMs are provided, while in other embodiments, PWM 16 is a single PWM. In accordance with the preferred embodiments of the invention, the PWM 16 can be used to generate pulse width modulated signals to control any of a variety of external devices such as the speed of a motor, a power supply, etc. Further and as will be explained in detail below, the PWM 16 comprises a multi-purpose ring oscillator circuit with a programmable delay. One use of the PWM's ring oscillator is to calibrate the programmable delay so as to provide greater resolution for the time width of the pulses.

Another use of the PWM's ring oscillator is as a temperature sensor. The frequency of oscillation of the ring oscillator is inversely proportional to the temperature of the environment (e.g., die temperature) in which the PWM 16 resides. As described herein, the PWM's ring oscillator can be programmed for optimal use as a temperature sensor. Specifically, the delay included in the ring oscillator is programmed to ensure an appropriate amount of delay for a given temperature sensing application. The frequency of oscillation of the ring oscillation is a function of temperature. Thus, the system determines the frequency, or a value corresponding to the frequency, of the ring oscillator, and does so by using a counter to count the number of pulses of the ring oscillator output over a known period of time. The higher the frequency of the ring oscillator output, the greater will be the resolution of the resulting temperature assessment, but if the frequency is too high, the counter will saturate. Thus, an optimal frequency range of the ring oscillator is desired to ensure sufficient resolution without saturating the counter used to determine the frequency. The ring oscillator therefore can serve two purposes and takes up very little space for its implementation.

The storage 14 of FIG. 1 comprises a processor readable storage medium such as volatile memory (e.g., random access memory), non-volatile storage (e.g., Flash storage, hard disk drive, read only memory, etc.), or combinations thereof. Storage 14 contains code 18 that is executable by processor 12. By executing code 18, the processor 12 performs some or all of the functionality described herein. The storage 14 also contains data storage 20. Data storage 20 contains one or more programmable registers and registers into which computed values are stored.

Figure 2:
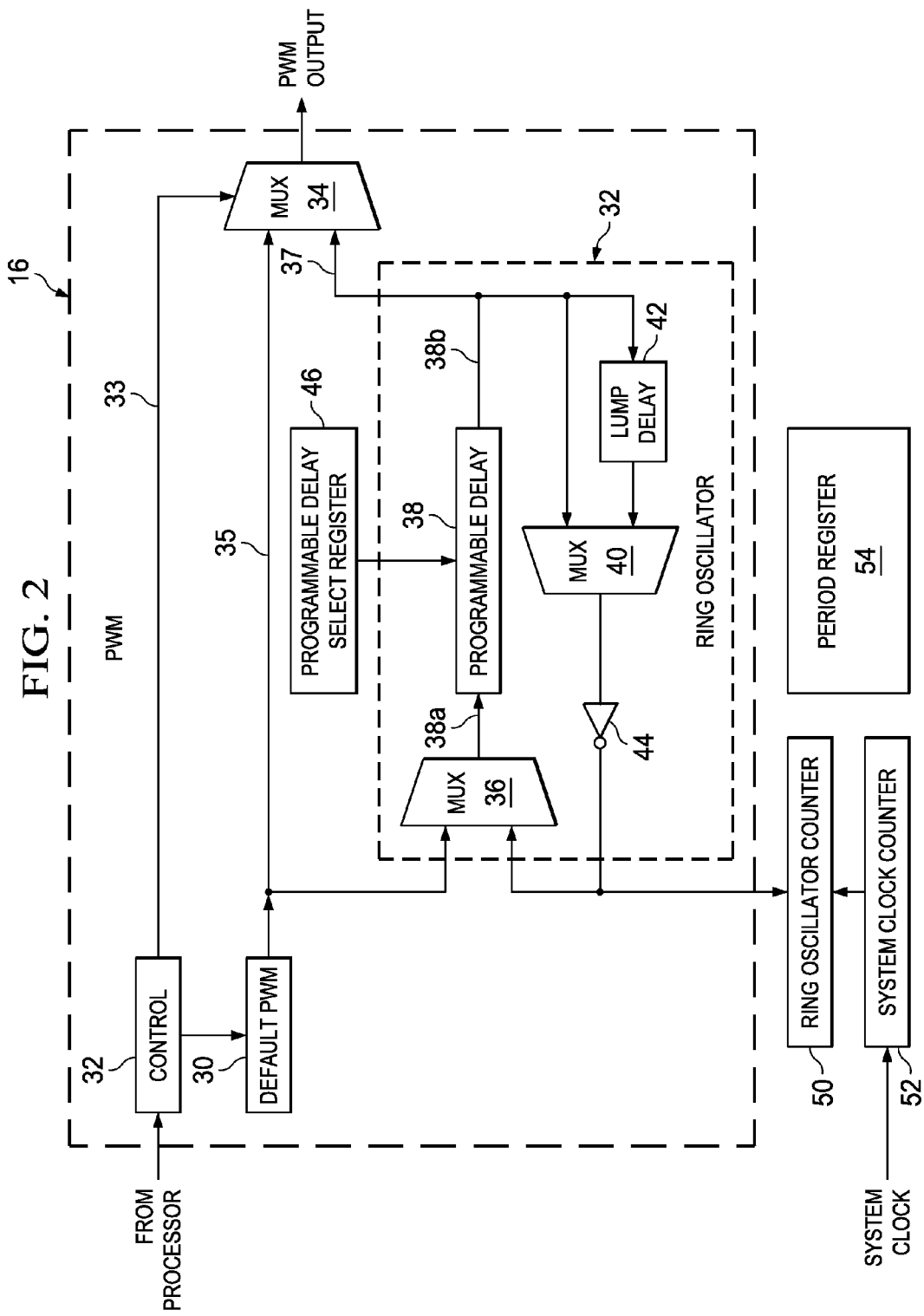
FIG. 2 illustrates a preferred embodiment of the pulse width modulator used as a temperature sensor.

FIG. 2 depicts an embodiment of the PWM 16. As shown, PWM 16 comprises a default PWM 30 controlled via control logic 32 by way of signals from the processor 12. The PWM 16 also contains a programmable delay 38 which receives the PWM signal from the default PWM 30 signal via a multiplexer (MUX) 36. The programmable delay 38 delays an input signal 38a and produces an output signal 38b that is a delayed version of the input signal 38a. The amount of the delay is programmable by an amount that is stored in programmable delay select register 46. Programmable delay select register 46 may be part of data storage 20 in storage 14. The multiplexer 34 receives the PWM signal 35 from the default PWM 30 or a delayed version of that PWM signal via programmable delay 38. A control signal 33 from control logic 32 selects the default PWM signal 35 or the delayed PWM 37 as the PWM output signal.

The default PWM 30 can modulate the leading and/or trailing edges of the output pulses in increments of a certain amount of time (e.g., 6.6 nanoseconds). The resolution of the programmable delay 38, however, is a smaller unit of time (e.g., 150 picoseconds). The programmable delay 38 can be used, for example, to extend the occurrence of the rising or trailing PWM signal by integer increments of such smaller unit of time (e.g., in increments of 150 ps).

Figure 3:
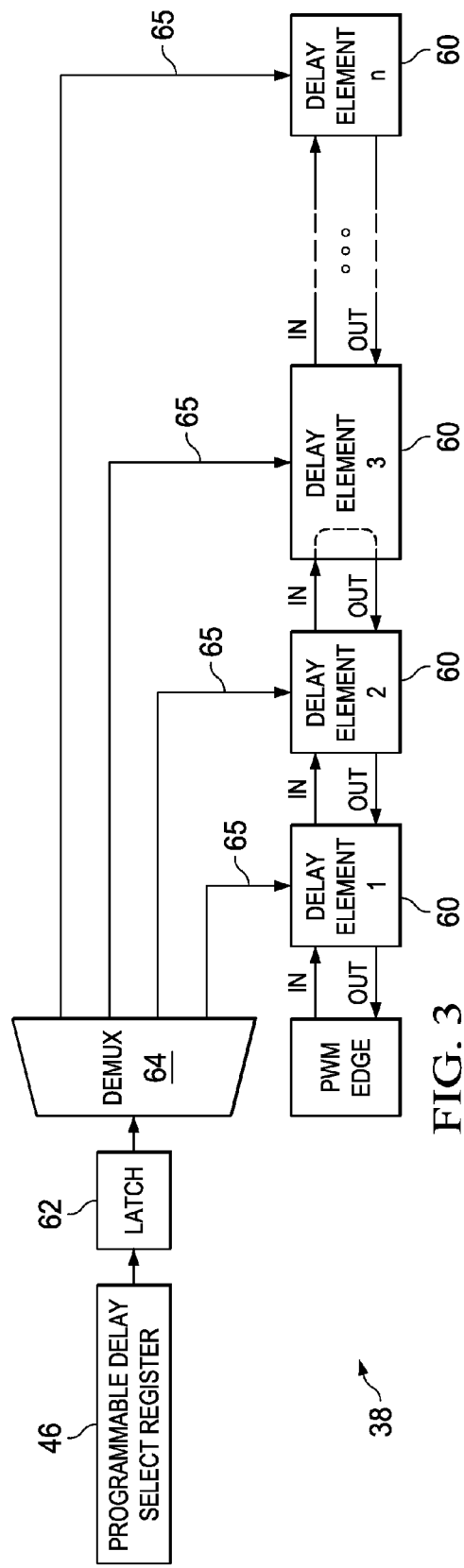
FIG. 3 shows an illustrative embodiment of a programmable delay used in the pulse width modulator.

Referring to FIG. 3, a preferred embodiment of programmable delay 38 is shown to include multiple delay elements 60. Some embodiments include 255 delay elements 60. The value of the programmable delay select register 46 is latched into latch 62 and then provided to demultiplexer (DEMUX) 64 to drive control signals 65 to the various delay elements 60. In accordance with the preferred embodiments, only one of the control signals 65 will be asserted to select the number of delay elements corresponding to the value in the programmable delay select register 46. For example, if the value in the programmable delay select register 46 is 10, then the control signal 65 corresponding to the tenth delay element 60 will be asserted. For all delay elements that are not selected, the input signal is passed through to the subsequent delay element in the chain (the "in" path) by the delay corresponding to the delay element. All delay elements 60 are presumed to have the same or similar amount of delay. Thus, as the PWM signal edge is passed through from one delay element to the next, it experiences an additional delay by each such delay element.

For the delay element that is selected by an asserted control signal 65 from demultiplexer 64, the input of the particular delay element is provided back to the preceding delay element as illustrated by the dashed path for delay element 3. The return "out" path back to the PWM edge being delayed preferably does not incur delay of the various delay elements. Thus, if the tenth delay is selected, the PWM signal propagates through 10 delay elements and is delayed by the combined delay of 10 delay elements before being turned around and sent back, albeit without delay, through the preceding 10 delay elements.

The amount of time delay caused by each delay element 60 can vary as a result of a variety of factors. For example, the type of semiconductor processing used can cause variations in the amount of delay. Further, variations in the operating voltage of the system as well as temperature can affect the amount of delay. Thus, the programmable delay 38 is calibrated to compute the amount of delay introduced by each delay element.

Calibrating to Determine Amount of Delay of Each Delay Element

The process for calibrating the programmable delay to compute the amount of delay introduced by each delay element is as follows. Referring back to FIG. 2, the multiplexer 36 and programmable delay 38 are configured as part of a ring oscillator 32, which also includes a multiplexer 40, a lump delay 42, and an inverter 44. The output 38b of the programmable delay 38 is provided back through the multiplexer 40 to the inverter 44 and back to the programmable delay 38 in a closed loop. As a result of this configuration, the output of the inverter 44 is an oscillatory signal. From the frequency of oscillation, the amount of delay introduced by each delay element can be computed. When performing this calibration process, the multiplexer 36 is configured so as to prevent the PWM signal from the default PWM 30 from reaching the programmable delay 30. Multiplexer 36 is controlled (control signal not shown) by control 32 to isolate the default PWM 30 from the ring oscillator 32 when calibrating the delay elements 60 or taking temperature measurements, or to provide access to the programmable delay 38 by the default PWM for purposes of pulse width modulation control.

The frequency of oscillation of the ring oscillator 32 is an inverse function of the number of delay elements selected for use—more delay elements 60 creates a lower oscillation frequency and fewer delay elements creates a higher oscillation frequency. The processor 12 programs the programmable delay select register 46 for a first number of delay elements (e.g., 10), and then permits the ring oscillator 32 to oscillate. The lump delay 42 (e.g., 3 ns) is used in order to bring down the high frequency of the ring oscillator— otherwise, the ring oscillator counter may saturate and the semiconductor logic may be clocked at a higher frequency than for which it was designed. Multiplexer 40 is controlled (control signal not shown) by control 32 to either select the lump delay 42 or not. The period register 54 (preferably part of data storage 20) is loaded with a value corresponding to the number of cycles of a system clock during which the ring oscillator output pulses are counted by way of ring oscillator counter 50. The ring oscillator counter 50 and a system clock counter 52 are initialized and then triggered to begin counting simultaneously. The system clock counter 52 begins counting system clock pulses from its initial value of, for example, 0 until it reaches the terminal count value in the period register 54. Once the system clock counter 52 reaches the terminal count value, the system clock counter 52 causes the ring oscillator counter 50 (which had been counting pulses of the ring oscillator output) to cease counting. At that point the ring oscillator counter 50 contains the number of ring oscillator pulses counted during the programmed number of system clock cycles in the period register 54.

The preceding count process is repeated for a different number of selected delay elements (e.g., 200). With a larger number of delay elements, the frequency of the ring oscillator 32 will be lower and thus the ring oscillator counter 50 will count fewer pulses during the same period of time defined via the system clock counter 52. At this point, two data points have been obtained and each data point includes a ring oscillator count value for a programmed number of delay elements. The slope of the line passing through both data points is then computed, and from the slope the amount of delay introduced by each delay element 60 can be determined. In some embodiments, the delay introduced by each delay element 60 is computed by computing $\frac{1}{2}*[1/(ring\_osc\_counter*sys\_clock/sys\_clock\_counter)]$ with the ring oscillator is configured for the larger number of delay elements, repeating the preceding calculation when the ring oscillator is configured for the smaller number of delay elements, and subtracting one result from the other.

Programming for Use as a Temperature Sensor

The ring oscillator 32 can also be programmed to optimize its use as a temperature sensor. As noted above, the frequency of oscillation of the ring oscillation varies with temperature. Further, the number of delay elements selected for use in the oscillator also affects the frequency of oscillation—fewer delay elements causes a higher oscillation frequency, more delay elements causes a lower frequency. Preferably, the ring oscillator should be programmed to oscillate at a high frequency for increased resolution, but not so high that the ring oscillator counter 50 saturates. If the ring oscillator counter 50 is implemented as a 16-bit counter, the counter will saturate once it has counted 65,535 cycles of the ring oscillator signal. Thus, for superior temperature sensing functionality, the delay 38 in the ring oscillator 32 should be programmed for an appropriate number of delay elements 60—more delay elements than that will slow down the clock rate of the ring oscillator and thus diminish the ring oscillator's temperature resolution ability, and fewer delay elements will increase the frequency and run the risk of saturating the ring oscillator counter 50.

Figure 4:
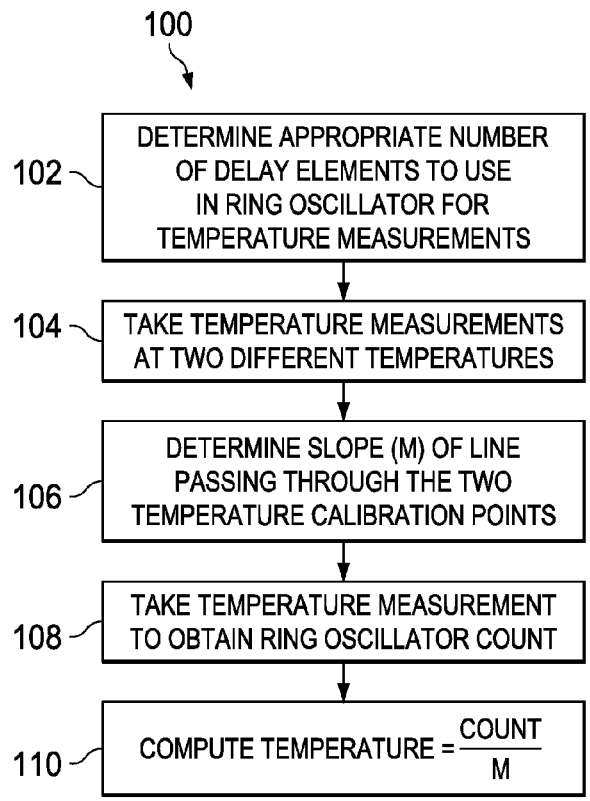
FIG. 4 shows a method in accordance with various embodiments of programming a pulse width modulator to function as a temperature sensor.

FIG. 4 shows an illustrative method 100 of operating the ring oscillator 32 as a temperature sensor. The actions shown in FIG. 4 can be performed in the order shown, or in a different order. Further, the actions can be performed sequentially or two or more of the actions can be performed in parallel. The actions preferably are performed or caused to be performed by the processor 12 executing code 18. Actions 102-106 comprise actions useful to calibrate the system for proper temperature measurements and actions 108 and 110 comprise actions useful to take a temperature measurement after the calibration is complete.

Figure 5:
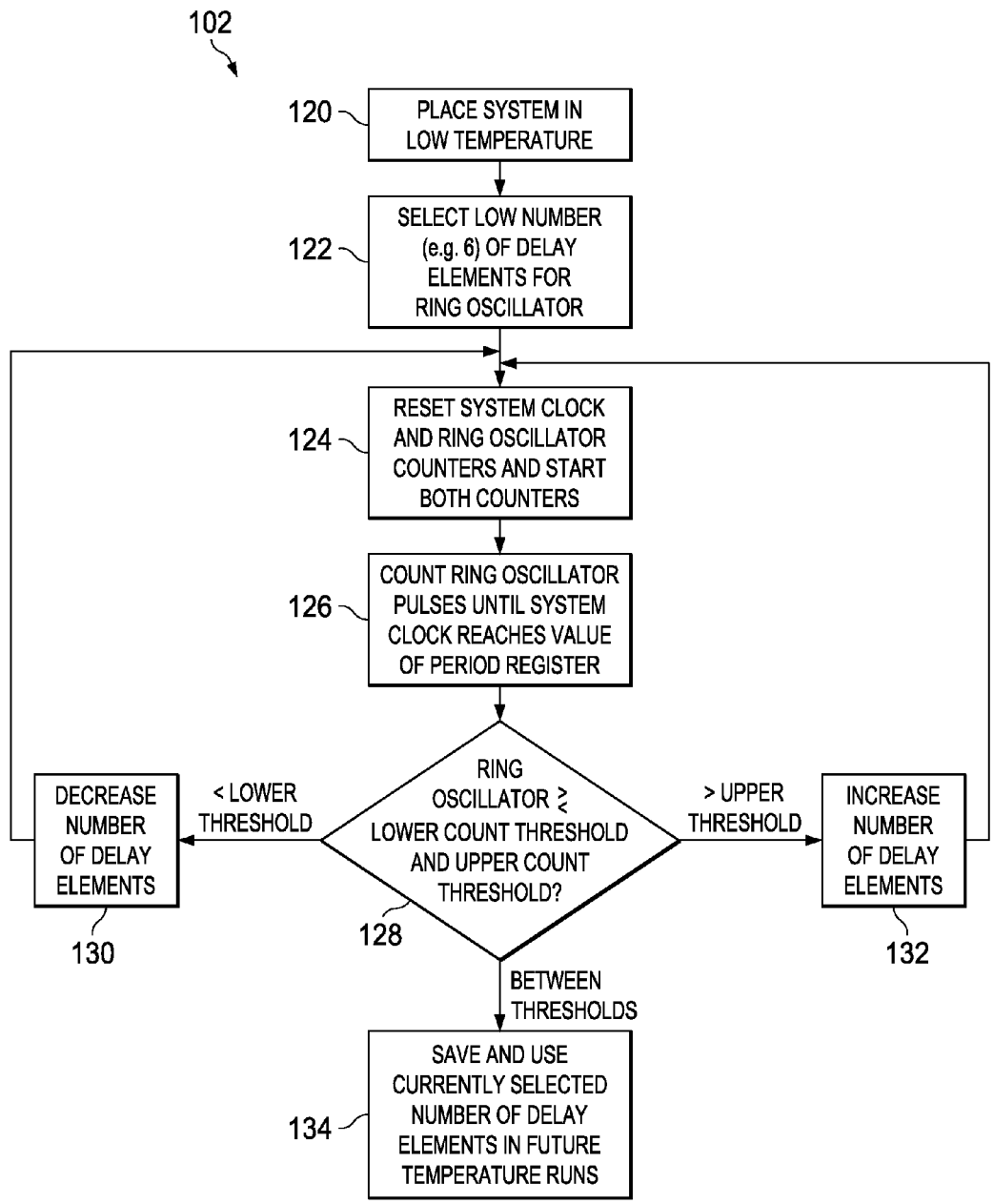
FIG. 5 illustrates an example of determining the appropriate number of delay elements to use with a ring oscillator used to measure temperature.

At 102, method 100 comprises determining an appropriate number of delay elements 60 to use in ring oscillator 32 for temperature measurements. Any of a variety of techniques can be employed to determine the appropriate number of delay elements. FIG. 5 illustrates one such technique.

The actions shown in FIG. 5 can be performed in the order shown, or in a different order. Further, the actions can be performed sequentially or two or more of the actions can be performed in parallel. The actions preferably are performed or caused to be performed by the processor 12 executing code 18. The actions preferably are performed or caused to be performed by the processor 12 executing code 18.

At 120, the system 10 is mounted to a printed circuit board (PCB) similar to that anticipated to be used in the end application and placed in a low temperature environment (e.g., a temperature chamber). The temperature preferably is the lowest temperature for which the system 10 is guaranteed to operate correctly. Low temperature is chosen because that is the temperature at which the ring oscillator has the highest frequency.

At 122, an initial number (e.g., 6) of delay elements 60 is chosen for use in the ring oscillator 32. At 124, the ring oscillator counter 50 and the system clock counter 52 are initialized to zero and then triggered to begin counting pulses of the ring oscillator 32 and the system clock, respectively. The counters 50 and 52 continue counting until system clock counter 52 reaches the value stored in the period register 54. The value in the period register 54 preferably comprises a value that is programmed or permanently set and is a value that permits a sufficient number of ring oscillator cycles to be counted to make an accurate temperature measurement while not saturating the ring oscillator counter. Fine control over the frequency of the ring oscillator is made as explained below to ensure high ring oscillator frequency without ring oscillator counter saturation. Once the system clock counter 52 reaches the value in the period register 54, the system clock counter 52 causes the ring oscillator counter 50 to stop counting ring oscillator pulses.

At 126, a determination is made as to whether the count value in the ring oscillator counter 50 is lower than a lower count threshold, greater than an upper count threshold or between the lower and upper count thresholds. The upper count threshold is set close enough to the maximum count value of the ring oscillator counter 50 that exceeding that upper threshold means there is a substantially likelihood that the ring oscillator counter 50 may saturate. If the ring oscillator counter value is below the lower count threshold, then the frequency of the ring oscillator is low enough that temperature measurement resolution is undesirably reduced. If the ring oscillator counter 50 is implemented as a 16-bit counter, then illustrative (but not the only) values of lower and upper count thresholds are 64,000 and 65,000, respectively.

If the ring oscillator count value is lower than the lower count threshold, then at 130, the number of delay elements is decreased. In some embodiments, the number of delay elements is decreased by 1 (e.g., from 6 down to 5). Control then loops back to action 124 and the process repeats. If, however, the ring oscillator count value is greater than the upper count threshold, then at 132, the number of delay elements is increased. In some embodiments, the number of delay elements is increased by 1 (e.g., from 6 up to 7). Control then loops back to action 124 and the process repeats. If the ring oscillator count value is between the lower and upper count thresholds which is desirable, then at 134, the currently selected number of delay elements is saved and used for the ring oscillator to take temperature measurements.

In the process of FIG. 5, the number of ring oscillator cycles occurring during a fixed number of system clock cycles is counted and the number of delay elements is adjusted so as to obtain the highest ring oscillator frequency which does not cause saturation of the ring oscillator counter. Alternatively, the ring oscillator frequency can be fixed (fixed number of delay elements) at a relatively low value (e.g., 6) so as to obtain a high frequency for improved temperature resolution, while systematically adjusting the number of system clock cycles in the period register 54 so that the ring oscillator counter 50 does not saturate.

Referring back to FIG. 4, once the appropriate number of delay elements is determined as described in the example above, then at 104, method 100 comprises taking temperature measurements using the ring oscillator 32 at multiple (e.g., 2), known temperatures. One temperature measurement preferably is taken shortly after power up of system 10. At that point, the temperature will be the ambient temperature of the environment in which the system resides. Another temperature measurement is taken at a higher temperature. For example, if the system is intended to operate between 0 and 80 degrees centigrade, the measurements may be made at 20 and 60 degrees. The two temperature conditions are known via other means (e.g., a different type of temperature sensor) for purposes of the calibration.

For each such temperature measurement, the counters 50 and 52 and period register 54 are used as described above. The ring oscillator counter 50 counts pulses of the ring oscillator 32 for a specified number of system clock periods. The ring oscillator counter value will be different between one temperature measurement and the other due to the different temperatures. The two count values and corresponding known temperatures are stored in data storage 20.

Figure 6:
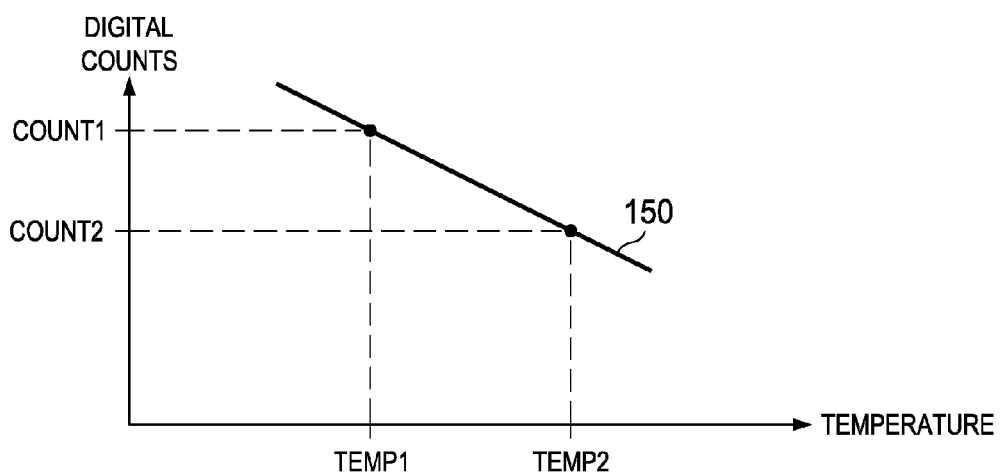
FIG. 6 shows an illustrative graph of two temperature calibration points used to measure the slope of a corresponding line, the slope usable to compute temperature.

These values represent two data points when plotted as digital count value versus temperature as shown in FIG. 6. In the graph of FIG. 6, TEMP1 and TEMP2 represent the two known temperatures for the preceding measurements. The COUNT1 and COUNT2 values are the corresponding ring oscillator 50 count values. Because the frequency of the ring oscillator 32 is lower at the higher temperature, TEMP2, the count value, COUNT2, will be lower (fewer oscillation pulses are counted due to the lower frequency). Conversely, the count value, COUNT1, is greater for the lower temperature, TEMP1, because of the elevated ring oscillator frequency.

The two points thereby define a line 150 that passes through both points. Line 150 has a slope (m) mathematically derived from the count and temperature values. Specifically, the slop (m) of line 150 is:

$$m = \frac{(COUNT1 - COUNT2)}{(TEMP2 - TEMP1)}$$

At 106 in FIG. 4, method 100 comprises determining slope (m) of line 150 that passes through the two temperature calibration points. At this point, the calibration process is complete and actual temperature measurements can be made.

At 108, a temperature measurement is taken at an unknown temperature to obtain a ring oscillator count value. At 110, the temperature is computed by dividing the ring oscillator count value by slope m.

As noted above, system 10 may comprise a multi-channel PWM. One or more of the channels may be programmed or dedicated to generate PWM signals, while one or more other channels may be configured to function as a temperature sensor. All such channels, however, may be structurally identical (i.e., same circuit configuration).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. Pulse width modulation circuitry comprising:
   A. control inputs;
   B. a final pulse width modulated output;
   C. default pulse width modulator having a control input coupled with the control inputs and having a default pulse width modulated output;
   D. ring oscillator circuitry having an input coupled with the default pulse width modulated output, a programmable delay select register input, a programmable delay output, and a ring oscillator output; and
   E. output multiplexer circuitry having a first input coupled to the default pulse width modulated output, a second input coupled to the programmable delay output, a control input coupled with the control inputs, and an output coupled with the final pulse width modulated output.

2. The modulation circuitry of claim 1 in which the ring oscillator circuitry includes:
   ring multiplexer circuitry having a first input coupled to the default pulse width modulated output, a second input coupled to the ring oscillator output, and an output;
   programmable delay circuitry having an input coupled with the output of the ring multiplexer circuitry, an input coupled with the programmable delay select register input, and an output coupled with the programmable delay output and the ring oscillator output.

3. The modulation circuitry of claim 1 in which the ring oscillator circuitry includes:
   lump delay circuitry having an input coupled with the programmable delay output, and a lump delay output;
   feedback multiplexer circuitry having a first input coupled with the programmable delay output, a second input coupled with the lump delay output, and an output; and
   inverter circuitry having an input coupled with the output of the feedback multiplexer and an output coupled with the ring oscillator output.

4. The modulation circuitry of claim 1 including ring oscillator counter having an input coupled with the ring oscillator output, a system clock counter having an input coupled to a system clock signal, and the ring oscillator counter and system clock counter being coupled together.

5. The modulation circuitry of claim 1 including a programmable delay select register having an output coupled with the programmable delay select register input.

6. The modulation circuitry of claim 1 including processor circuitry having control outputs coupled with the control inputs.

7. Programmable delay circuitry comprising:
   A. programmable delay select register input;

B. latch circuitry having an input coupled with the programmable delay select register input and having an output;
C. demultiplexer circuitry having an input coupled with the output of the latch circuitry and having plural select outputs;
D. pulse width modulation edge circuitry having an output and an input; and
E. plural delay elements coupled to the output and input of the pulse width modulation edge circuitry, each delay element having:
  an in input,
  an in output,
  a delay circuit between the in input and the in output,
  an out input,
  an out output,
  a direct connection between the out input and the out output, and
  a select input coupled with one select output; and a first delay element having the in input connected to the output of the pulse width modulation edge circuitry, having the out output connected to the input of the pulse width modulation edge circuitry, having the in output coupled to the in input of a second delay element, and having the out input connected to the out output of the second delay element.

8. The delay circuitry of claim 7 including a third delay element having the in input connected to the in output of the second delay element, having the out output connected to the out input of the second delay element, having the in output coupled to the in input of a fourth delay element, and having the out input connected to the out output of the fourth delay element.

9. The delay circuitry of claim 7 in which each delay element includes return circuitry connecting the in input of that delay element to the out output of that delay element in response to an asserted select signal on the select input of that delay element.

* * * * *